United States Patent
Windisch

(10) Patent No.: US 8,710,486 B2
(45) Date of Patent: Apr. 29, 2014

(54) OPTOELECTRONIC SEMICONDUCTOR CHIP AND METHOD FOR MANUFACTURING A CONTACT STRUCTURE FOR SUCH A CHIP

(75) Inventor: Reiner Windisch, Pettendorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 178 days.

(21) Appl. No.: 12/523,501

(22) PCT Filed: Jan. 11, 2008

(86) PCT No.: PCT/DE2008/000044
§ 371 (c)(1),
(2), (4) Date: Aug. 19, 2009

(87) PCT Pub. No.: WO2008/092417
PCT Pub. Date: Aug. 7, 2008

(65) Prior Publication Data
US 2010/0038667 A1  Feb. 18, 2010

(30) Foreign Application Priority Data

Jan. 31, 2007  (DE) .......................... 10 2007 005 672
Apr. 30, 2007  (DE) .......................... 10 2007 020 291

(51) Int. Cl.
*H01L 29/06* (2006.01)
*H01L 31/00* (2006.01)

(52) U.S. Cl.
USPC .......... 257/13; 257/79; 257/94; 257/E33.005; 257/E33.062; 257/E33.064

(58) Field of Classification Search
None
See application file for complete search history.

(56) References Cited

U.S. PATENT DOCUMENTS

| 5,789,768 | A | 8/1998 | Lee et al. |
| 6,420,732 | B1 | 7/2002 | Kung et al. |
| 6,512,248 | B1 | 1/2003 | Takeuchi et al. |
| 6,929,966 | B2 | 8/2005 | Illek et al. |
| 7,283,577 | B2 | 10/2007 | Schmid et al. |
| 7,435,999 | B2 | 10/2008 | Windisch et al. |
| 7,692,204 | B2 | 4/2010 | Stein et al. |
| 7,838,892 | B2 | 11/2010 | Wirth |
| 2003/0111667 | A1* | 6/2003 | Schubert .......................... 257/98 |
| 2003/0141512 | A1 | 7/2003 | Bruderl et al. |
| 2003/0164503 | A1* | 9/2003 | Chen ............................... 257/79 |

(Continued)

FOREIGN PATENT DOCUMENTS

| DE | 102 03 801 A1 | 8/2003 |
| DE | 103 07 280 A1 | 6/2004 |

(Continued)

*Primary Examiner* — Benjamin Sandvik
*Assistant Examiner* — Leslie Pilar Cruz
(74) *Attorney, Agent, or Firm* — Slater & Matsil, L.L.P.

(57) ABSTRACT

An optoelectronic semiconductor chip with a semiconductor body having a semiconductor layer sequence with an active region suitable for generating radiation is specified, wherein the semiconductor chip comprises a radiation-transmissive and electrically conductive contact layer arranged on a semiconductor body and electrically connected to an active region. The contact layer adjoins a barrier layer of the semiconductor layer sequence and a contact layer is applied to the semiconductor body having a structure. An electrode is arranged on the semiconductor body on a side of the active region facing away from the barrier layer and having a contact area, wherein the contact layer adjoins the barrier layer with its entire surface in a region of the barrier layer that is covered by the contact area of the electrode.

33 Claims, 4 Drawing Sheets

(56) References Cited

U.S. PATENT DOCUMENTS

| | | |
|---|---|---|
| 2004/0104390 A1* | 6/2004 | Sano et al. .................. 257/78 |
| 2004/0124428 A1 | 7/2004 | Lin et al. |
| 2004/0135166 A1 | 7/2004 | Yamada et al. |
| 2004/0178415 A1 | 9/2004 | Hsu et al. |
| 2004/0262620 A1 | 12/2004 | Albrecht et al. |
| 2006/0222040 A1 | 10/2006 | Schmid et al. |
| 2007/0012937 A1 | 1/2007 | Liu et al. |
| 2007/0018184 A1* | 1/2007 | Beeson et al. ............... 257/98 |
| 2007/0145381 A1* | 6/2007 | Unno et al. .................. 257/79 |
| 2007/0278508 A1 | 12/2007 | Baur et al. |
| 2008/0157107 A1* | 7/2008 | Shei et al. .................... 257/97 |
| 2008/0157109 A1* | 7/2008 | Hon .............................. 257/98 |
| 2009/0008751 A1 | 1/2009 | Illek et al. |

FOREIGN PATENT DOCUMENTS

| | | |
|---|---|---|
| DE | 102 61 676 A1 | 7/2004 |
| DE | 10 2004 021 175 A1 | 11/2005 |
| DE | 10 2004 057 802 A1 | 6/2006 |
| EP | 1 531 499 A2 | 5/2005 |
| JP | 2001-189493 A | 7/2001 |
| TW | 541716 B | 7/2003 |
| TW | 573374 B | 1/2004 |
| TW | I331411 B | 10/2010 |
| WO | WO 2005/117147 A1 | 12/2005 |
| WO | WO 2007/124708 A1 | 11/2007 |

* cited by examiner

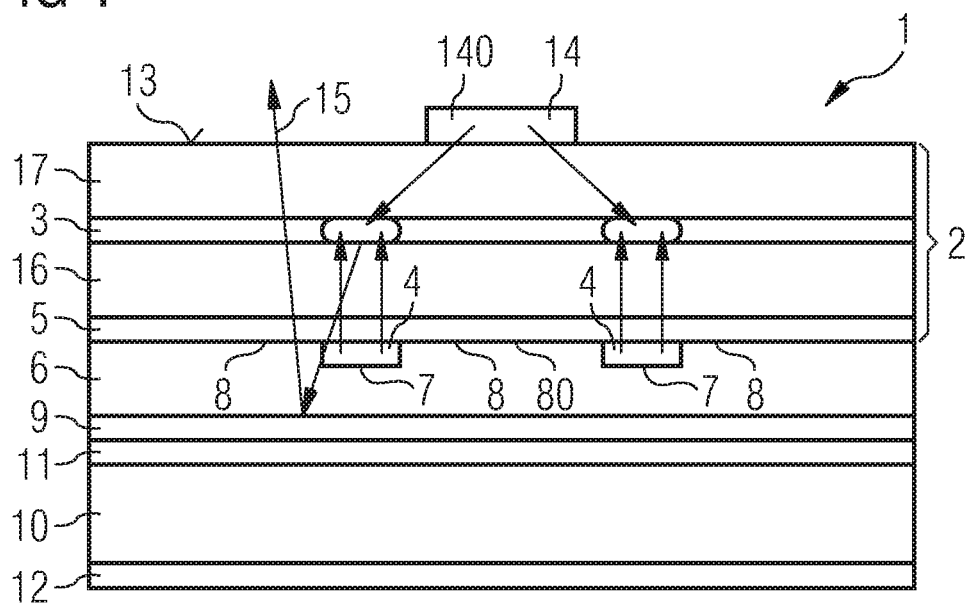
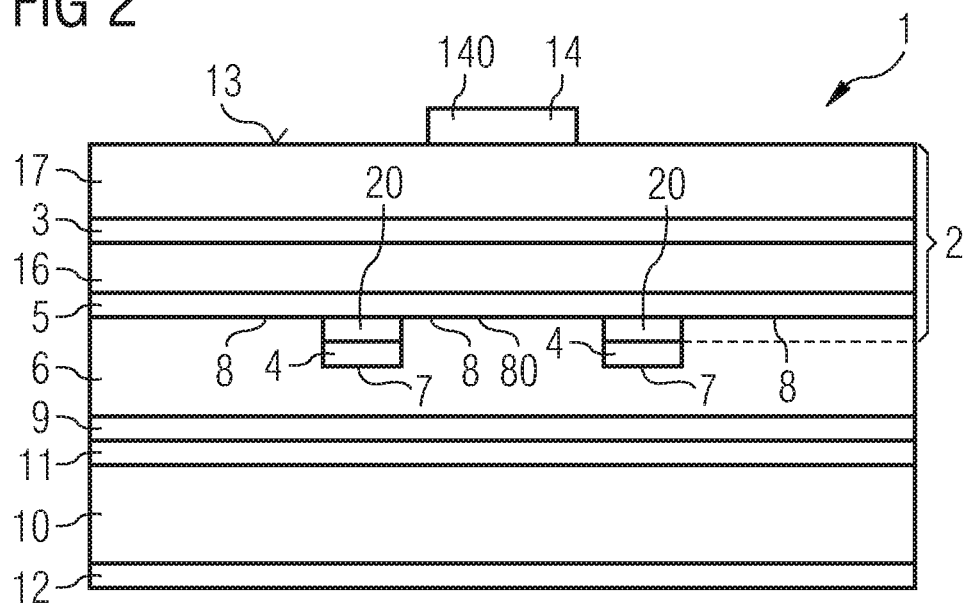

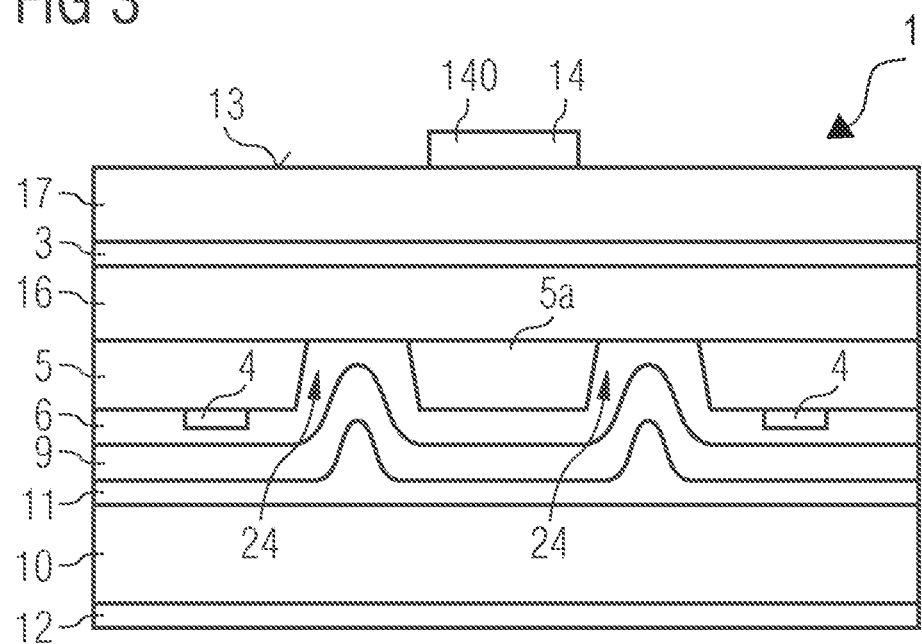
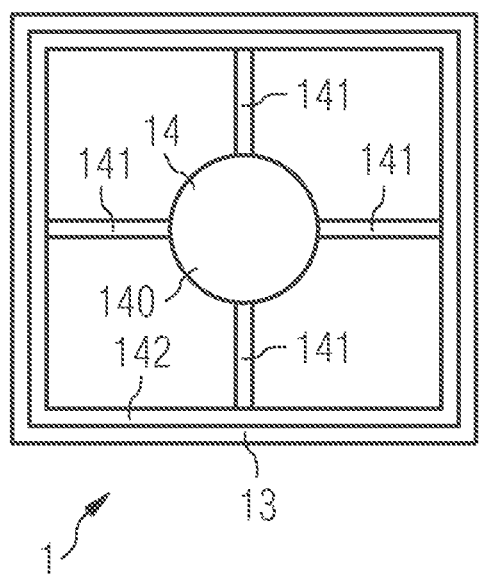
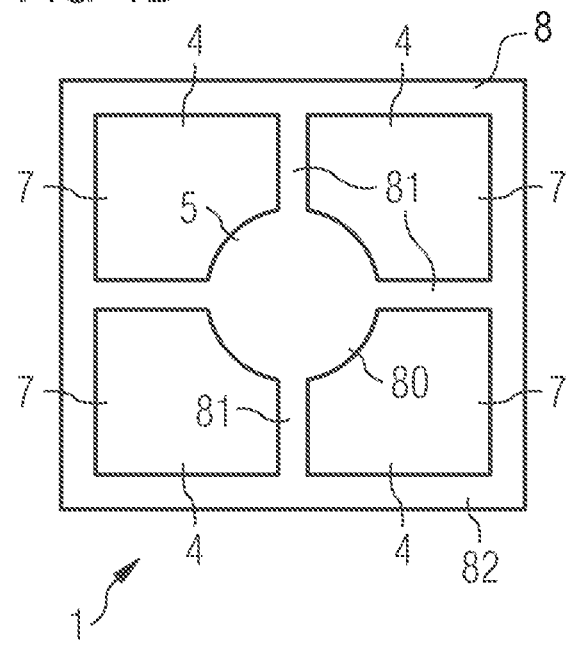

OPTOELECTRONIC SEMICONDUCTOR CHIP AND METHOD FOR MANUFACTURING A CONTACT STRUCTURE FOR SUCH A CHIP

This patent application is a 371 filing of PCT/DE2008/000044, filed Jan. 11, 2008, which claims the priority of German patent applications 10 2007 005 672.0, filed Jan. 31, 2007 and 10 2007 020 291.3 filed Apr. 30, 2007, each of which is hereby incorporated by reference in its entirety.

TECHNICAL FIELD

The present invention relates to an optoelectronic semiconductor chip, in particular, a radiation-generating semiconductor chip, e.g., a light-emitting diode chip.

SUMMARY

In one aspect, the invention specifies a semiconductor chip with enhanced efficiency, as well as a manufacturing method suitable for manufacturing such semiconductor chips.

By means of a contact layer that is adjacent both to the semiconductor and to a structured connection layer applied to the semiconductor body, the charge carrier injection into the semiconductor body can advantageously be concentrated on the areas of the semiconductor body that are covered by the connection layer. In an area of the semiconductor body free of the connection layer, in which the contact layer is adjacent to the semiconductor body, a charge carrier injection can be reduced with respect to the areas covered by the connection layer. Accordingly, only a reduced number of charge carriers move from the areas directly adjacent to the semiconductor body into the active region, whereby only low radiation power is produced in these regions of the active region.

The contact area on the electrode arranged on the side of the semiconductor body facing away from the contact layer, e.g., the area of the electrode that is provided with a bond wire, is often very absorptive for the radiation generated in the active region. Therefore it is advantageous to reduce, in a targeted manner, the injection of charge carriers into the semiconductor body from the side facing away from the electrode in the region covered by the connection area. This can be achieved via a structured connection layer that is cut out in this area. The radiation power generated underneath the connection area, and thereby the radiation power that can be absorbed in the connection area, are reduced.

Additional advantageous embodiments of an optoelectronic semiconductor chip and of a method for manufacturing a contact structure for a semiconductor chip suitable for generating radiation are disclosed herein.

BRIEF DESCRIPTION OF THE DRAWINGS

Embodiments for an optoelectronic semiconductor chip and for a method for manufacturing a contact structure for a semiconductor chip suitable for generating radiation are to be described in detail below with reference to the figures. Therein:

FIG. 1, shows a schematic cross section of one embodiment of an optoelectronic semiconductor chip, FIG. 2, shows a schematic cross section of an additional embodiment of an optoelectronic semiconductor chip, FIG. 3, shows a schematic cross section of an additional embodiment of an optoelectronic semiconductor chip, FIG. 4, shows in FIGS. 4A and 4B, schematic plan views onto the upper side and the lower sides, respectively, on one embodiment of an optoelectronic semiconductor chip.

DETAILED DESCRIPTION OF ILLUSTRATIVE EMBODIMENTS

Figure 5A:
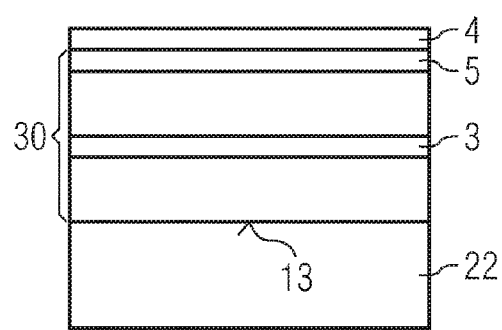
FIG. 5, shows in FIGS. 5A-5D, an embodiment of a method according to the invention for manufacturing a contact structure for an optoelectronic semiconductor chip suitable for generating radiation.

FIGS. 1 and 2 show respective schematic cross-sectional views of different exemplary embodiments of an optoelectronic semiconductor chip 1, e.g., an LED chip.

Each semiconductor chip 1 has a semiconductor body 2 that comprises a semiconductor layer sequence with an active region 3 suitable for generating radiation. The semiconductor layer sequence, which is preferably grown epitaxially on a growth substrate (not explicitly shown), for example, by means of MOVPE (Metal Organic Vapor Phase Epitaxy), further comprises a barrier layer 5. In the embodiments of the semiconductor chip represented in FIGS. 1 and 2, the barrier layer is constructed as a continuous layer.

A radiation-transmissive and electrically conductive contact layer 6 that adjoins both a connection layer 4, arranged on barrier layer 5, applied to semiconductor body 2 and cut out in certain areas, and barrier layer 5 is arranged on the semiconductor body 2. The connection layer 4 can be applied, for example, by means of a physical deposition process such as a sputtering process.

An electrode 14 is arranged on the semiconductor body 2 of semiconductor chip 1 on a side of the active area 3 facing away from the barrier layer 5, and in particular, on an upper side 13 of semiconductor body 2. As illustrated in FIG. 4A, electrode 14 has a connection area 140. The latter is preferably provided with a bonding wire for electrical connection and can accordingly be formed as a bonding pad. The electrode can additionally have several sections 141 electrically connected to the connection area 140 for achieving a current expansion across the upper side 13 of the semiconductor body 2 starting from the connection area 140 (not explicitly shown in FIGS. 1 and 2; see FIG. 4). The semiconductor chip 1 can be electroconductively connected via the connection area 140 to an external connection lead, for example, a lead frame or a lead plate. The electrode 14 can be configured as a metallization.

In the area of direct mechanical contact of the contact layer with the connection layer, an electrical contact area 7 is formed, via which contact layer 6 is electroconductively connected to active region 3. A barrier region 8 is formed in the area of direct mechanical contact of contact layer 6 with barrier layer 5.

An injection of charge carriers into semiconductor body 2 via the electrical barrier area 8 is more difficult compared to an injection of charge carriers into the semiconductor body 2 via the electrical contact area 7. In particular, the materials of the contact layer and the barrier layer are expediently selected such that an electrical contact resistance of contact layer 6 to connection layer 4 is smaller than an electrical contact resistance of contact layer 6 to barrier layer 5. The electrical contact resistance of contact layer 6 to the connection layer 4 preferably exhibits ohmic behavior, while the electrical contact resistance of contact layer 6 to barrier layer 5 exhibits non-ohmic behavior. The electrical contact area 7 and barrier area 8 are arranged in parallel with respect to contact layer 6.

Therefore considerably fewer charge carriers are injected into the semiconductor body via barrier area 8 than via contact area 7.

It may be additionally noted that barrier layer 5 need not be a layer provided separately in the semiconductor body 2; rather, it can also be integrated into the semiconductor layer 16. In particular, an area of the semiconductor layer 16 facing the contact layer 6 can serve as a barrier layer 5.

To achieve a large contact resistance of contact layer 6 to barrier layer 5, a dopant concentration of the barrier can advantageously be selected to be low. For instance, the dopant concentration in the barrier layer can be $1*10^{18}$ $1/(cm^3)$ or less, for example, for a p-type barrier layer, preferably doped with Mg or C, or for an n-type barrier layer, preferably doped with Si or Te.

Such a low doping can be sufficient for an elevated contact resistance of contact layer 6 to barrier layer 5 with respect to the contact resistance of contact layer 6 to the connection layer 4. The conductivity in semiconductor body 2 in the direction of active region 3 is not significantly reduced by such a low doping of barrier layer 5.

By a targeted formation of one or a plurality of electrical contact and barrier areas 7 and 8, respectively, a targeted current injection in certain areas, i.e., an inhomogeneous current injection, into semiconductor body 2 can be achieved by means of a continuous contact layer, or even despite an electrically conductive contact layer 6. The charge carrier injection into certain areas can be achieved by different contact resistances of the contact layer to the terminals on the one hand, and the semiconductor body on the other. For targeted current injection into certain areas of the semiconductor body, there is, in particular, no necessity for a dielectric layer arranged between semiconductor body 2 and contact layer 6 that comprises, for electrically contacting the contact layer 6 to the semiconductor body 2, cutouts that can be filled with an electrically conductive material producing the electrical connection between the mirror layer 9 and the semiconductor body 2.

An electrically conductive mirror layer 9, preferably formed as a continuous layer, is formed on a side of contact layer 6 facing semiconductor body 2. Mirror layer 9 is preferably electroconductively connected over its entire surface to contact layer 6. Many metals, Ag among them, adhere markedly better to some radiation-transmissive electrically conductive oxide materials of which contact layer 6 is produced than to a dielectric layer such as SiN or $SiO_2$, so that the use of pure mirror materials without admixtures or (adhesion-promoting) intermediate layers is simplified with the contact layer 6 of the invention.

To avoid direct contact between the semiconductor material of semiconductor body 2 and mirror layer 9, contact layer 6 is preferably interposed continuously between mirror layer 9 and semiconductor body 2. The formation of a reflectivity-reducing alloy of the material of the mirror layer 9 and the semiconductor material can thereby be prevented. Thus the mirror layer 9 can have a substantially uniform high reflectivity over its entire lateral extent.

The semiconductor body 2 is preferably configured as a thin-film semiconductor, for which a growth substrate for the semiconductor layer sequence is removed from the semiconductor layer sequence in certain areas (not shown) or completely.

To increase the mechanical stability of semiconductor body 2, it is expediently arranged on a carrier 10 that is different from the growth substrate of the semiconductor layer sequence. Thus semiconductor chip 1 is constructed as a thin-film semiconductor chip. The thin-film semiconductor chip comprises the thin-film semiconductor body and the carrier.

A connecting layer 11 is arranged between mirror layer 9 and carrier 10 for fixation of semiconductor body 2 on carrier 10. The connecting layer 11 and/or carrier 10 are preferably formed to be electrically conductive, so that semiconductor chip 1 can be contacted via carrier 10, connecting layer 11, minor layer 9 and contact layer 6.

A mounting electrode 12, by means of which the semiconductor chip 1 can be arranged on an external connection lead, for example, a terminal lead of a surface-mountable component or the terminal lead of a circuit board, fixed and electro-conductively connected thereto, is arranged on a side of carrier 10 facing away from contact layer 6. Mounting electrode 12 can be constructed as a metallization.

By the application of suitable voltages to electrode 14 and mounting electrode 12 in the operation of semiconductor chip 1, charge carriers are injected into active region 3 and can then recombine there, emitting radiation. In FIG. 1, arrows are provided, indicating the charge carriers injected via electrode 14 and connection layer 4 into semiconductor body 2.

Due to the design and arrangement of the respective contact areas 7 shown in FIGS. 1 and 2, the generation of radiation in the active area 3 can be concentrated into preferred regions. It is highly probable that radiation produced from zones of active region 3 that are covered by the electrode 14 vertically as viewed from the active region 3 is absorbed by electrode 14. The connection area 140 is generally formed to be comparatively thick, particularly for a wire bond connection. Therefore a not inconsiderable portion of the radiation power can be absorbed in the connection area 140.

The electrical contact areas 7 are therefore a distance away laterally from connection area 140 of electrode 14. For this purpose, the structured contact layer 4 has a cutout in an area covered by connection area 140 of electrode 14. Contact layer 6, in particular, immediately borders the entire surface of an area of barrier layer 5 in the barrier area 80 that is covered by connection area 140 of electrode 14. The barrier area 80 preferably covers the entire connection area 140 of electrode 14.

Unlike the embodiment of a semiconductor chip 1 represented in FIG. 1, an intermediate layer 20 of semiconductor chip 1 that has a structure is arranged between the structured connection layer 4 and barrier layer 5 in the semiconductor chip represented in FIG. 2. By means of the structured intermediate layer, the electrical contact formation between the connection layer 4 and the semiconductor body 2 can be optimized independently of the barrier properties of the barrier layer 5. The contact layer 6 expends through intermediate layer 20, preferably structured and cut out corresponding to the connection layer 4. The electrical contact resistance between connection layer 4 and intermediate layer 20 is expediently smaller than the contact resistance between contact layer 6 and barrier layer 5.

The intermediate layer 20 expediently has a higher dopant concentration than barrier layer 5. The formation of an electrical contact resistance between the connection layer 4 and the intermediate layer 20 that is smaller than the electrical contact resistance between the barrier layer 5 and the contact layer 6 is facilitated in this way. For this purpose, the intermediate layer 20 can have a dopant concentration of, for example, $1*10^{19}$ $1/(cm^3)$ or more, preferably $1*10^{20}$ $1/(cm^3)$ or more, especially preferably $1*10^{21}$ $1/(cm^3)$ or more. Intermediate layer 20 expediently has the same conductivity type as semiconductor layer 16 or barrier layer 5.

For further prevention of a generation of radiation in active region 3 underneath connection area 140 of electrode 14, barrier area 8 is widened laterally with respect to the lateral extension of connection area 140 in a (sub)region that mutually overlaps with connection area 140 of electrode 14. Due to the arrangement of the respective contact areas 7, the generation of radiation during the operation of semiconductor chip 1 is concentrated on areas of active region 3 not covered by connection area 140 of electrode 14, compare the bounded areas in FIG. 1 in which charge carriers injected via electrode 14 and the respective electrical contact area 7 recombine, generating radiation. These recombination regions are spaced away laterally from electrode 14.

Radiation generated in active region 3 and running in the direction of contact layer 6 passes through the radiation-transmitting contact layer 6 and strikes minor layer 9. The radiation striking minor layer 9 is reflected by mirror layer 9 back into semiconductor body 2 and is coupled out of semiconductor chip 1 via the upper side 13 of semiconductor body 2 that faces minor layer 9. Such a radiation path is indicated by the beam 15. Due to the reflection of the radiation from mirror layer 9, absorption of radiation in elements such as connecting layer 11 or carrier 10 arranged on the side of the mirror facing away from active region 3 can be eliminated. In addition, the radiation power exiting via the upper side 13 can be increased.

Nonradiating recombinations of charge carriers can typically be prevented with a high degree of probability in a lateral peripheral edge of the semiconductor body 2, in particular, of active region 3. To reduce the charge carrier injection via contact layer 6 into semiconductor body 2 in this peripheral area, barrier region 8 typically covers the peripheral area of the active region 3.

The active region 3 is arranged between a first semiconductor layer 16 and a second semiconductor layer 17 that have different conductivity types (n-type or p-type). Semiconductor layers 16 and 17 can each comprise several layers, of which one can be formed as a sheath layer, which increases the inclusion of charge carriers in the active region 3 and thus efficiency of the semiconductor chip's conversion of electrical power into radiation power. The semiconductor body 2, including active region 3, barrier layer 5, first semiconductor layer 16 and/or second semiconductor layer 17, preferably contains a III-V semiconductor material. Second semiconductor layer 17 can comprise, for example, a p-doped or an n-doped layer, such as an InGaAlP, InAlP, InGaP, GaAs or AlGaAs layer, wherein the dopant can comprise carbon or magnesium for a p-type doping or silicon or tellurium for an n-type doping. Second semiconductor layer 17 can be formed, for example, in such a manner that a current applied via electrode 14 can expand laterally with a low resistance in second semiconductor layer 17. First semiconductor layer 16 can comprise, for example, an n-doped or a p-doped layer, such as an InGaAlP, InAlP, InGaP, GaAs or AlGaAs layer. The barrier layer 5 can comprise an n-doped or a p-doped layer, such as an InGaAlP, InAlP, InGaP, GaAs or AlGaAs layer. Intermediate layer 20 can comprise an n-doped or a p-doped layer, such as an GaP, GaAs or AlGaAs layer. AlGaAs is particularly suitable for electrical contact formation between intermediate layer 20 and connection layer 4.

The semiconductor chip 1 is preferably designed to generate visible radiation.

Connection layer 4 is preferably implemented as a radiation-transmissive and electrically conductive oxide, for example, a metal oxide such as zinc oxide, tin oxide or indium-tin oxide. Connection layer 4 can also comprise an alloyed metal contact, however, comprising AuGe or AuZn, for instance. The use of a connection layer 4 made of a radiation-transmissive and electrically conductive oxide is preferred over the use of an alloyed metal contact, however, since the alloying of the metal in order to bring about an ohmic contact with the barrier layer 5 causes the alloyed metal to have a roughness.

Contact layer 6 is preferably constructed as a radiation-transmissive and electrically conductive oxide, for example, a metal oxide such as zinc oxide, tin oxide or indium-tin oxide. In case connection layer 4 and contact layer 6 both consist of a radiation-transmissive and electrically conductive oxide, they are produced in different process steps to cause an electrical contact resistance of contact layer 6 to the connection layer 4 to be lower than an electrical contact resistance of contact layer 6 to the barrier layer 5. For this purpose, connection layer 4 and contact layer 6 are preferably doped differently, e.g., contact layer 6 and connection layer 4 can have different doping. For instance, connection layer 4 can have Al dopants, while the contact layer 6 can have Ga dopants.

The active region can 3 comprise, for example, a phosphite compound semiconductor material, in particular, InGaAlP. Mirror layer 9 is preferably formed as an Au, Ag or AuZn mirror layer. Such mirror layers have a particularly high reflectivity for radiation that can be generated with phosphite compound semiconductor materials, particularly in the yellow to red spectral range.

Carrier 10 can contain or consist of germanium of GaAs. Connecting layer 11 can be implemented as a solder layer, in particular, a layer containing AuSn, as an electrically conductive adhesive layer or as a layer formed by means of a wafer-bonding process. Active region 3 preferably comprises a double heterostructure or a single or multiple quantum well structure, whereby the quantum efficiency of the active region can be increased. Within the scope of the present application, the term quantum well structure comprises any structure in which charge carriers experience or can experience a quantization of their energy states due to influence ("confinement"). In particular, the term quantum well structure does not contain any information on the dimensionality of the quantization. It therefore includes, among other things, quantum troughs, quantum wires and quantum dots, as well as any combination of these structures.

FIG. 4 shows schematic plan views onto a semiconductor chip according to FIG. 1 or 2. A plan view onto the upper side 13 of semiconductor body 2 is represented in FIG. 4A, and a plan view onto connection layer 4 and barrier layer 5 is shown in FIG. 4B.

Electrode 14 has a connection area 140 that is provided for connecting the electrode 14 to an external connection lead, for example, via a bond wire. Electrode 14 additionally has a conductive electrode frame 142 that is arranged in a peripheral area of upper side 13 and is connected via conductive webs 141 to connection area 140. A lateral current expansion outwards from electrode area 140 can be achieved by means of this construction of electrode 14. In the cross-sectional views of the respective semiconductor chip 1 presented in FIG. 1 and FIG. 2, the electrode frame and the electrode webs are not represented for reasons of comprehensibility.

As represented in FIG. 4B, the design of barrier layer 8 is adapted to the design of the electrode 14 shown in FIG. 4A.

As shown in FIG. 4B, semiconductor chip 1 has several electrical contact areas 7 separated from one another, as well as a contiguous barrier area 8 (which includes sections 80, 81 and 82) that is constructed corresponding to electrode 14 shown in FIG. 4A. Barrier layer 8 accordingly comprises an area 80 that is connected via webs 81 to a barrier frame 82.

The sections of barrier area 8 corresponding to the respective sections of electrode 14 preferably have a greater lateral extent than do the corresponding electrode sections. The barrier area 8 is preferably constructed in such a manner that, despite the current expansion in the semiconductor body, a generation of radiation in the active region underneath the electrode structure can be largely avoided.

FIG. 3 shows an additional embodiment of an optoelectronic semiconductor chip 1, which substantially corresponds to the semiconductor chips shown in FIGS. 1 and 2. Unlike the embodiments of a semiconductor chip 1 shown in FIGS. 1 and 2, the semiconductor body 2 and, in particular, barrier layer 5 of the semiconductor chip shown in FIG. 3 have one or more cutouts 24, which preferably taper down in the direction of active region 3 starting from a surface of barrier layer 5 facing away from active region 3.

Contact layer 6 is constructed conformally on the structured barrier layer 5 and extends into the cutout(s) 24. Mirror layer 9 is constructed conformally on contact layer 6 and can likewise extend into the cutout(s) 24.

The cutout(s) 24 are preferably formed in such a manner that a section 5a of the structure barrier layer 5 completely covers connection area 140 of electrode 14.

By means of the cutout(s) tapering down in the direction of active region 3 and, in particular, the mirror layer 9 arranged therein, the distribution of the angles of incidence of radiation reflected at the mirror layer 9 and reaching the upper side 13 can spread more widely than for a continuously flat mirror layer. The probability is thereby increased that radiation reflected from the mirror, strikes upper side 13 of semiconductor body 2 at an angle less than a limit angle of total reflection and can thus be coupled out of the semiconductor body 2. Accordingly, a portion of the radiation continually totally reflected in the semiconductor body 2 can be reduced by the cutout(s) 24, whereby the outcoupling efficiency of the semiconductor chip 1 is increased.

Cutouts 24 can have a microprism structure, for example, and are preferably produced by a suitable etching process.

FIGS. 5 and 6 each show in the respective FIGS. 5A-5D and 6A-6D an embodiment of a method according to the invention for manufacturing a contact structure for an optoelectronic semiconductor chip suitable for generating radiation.

Figure 6A:
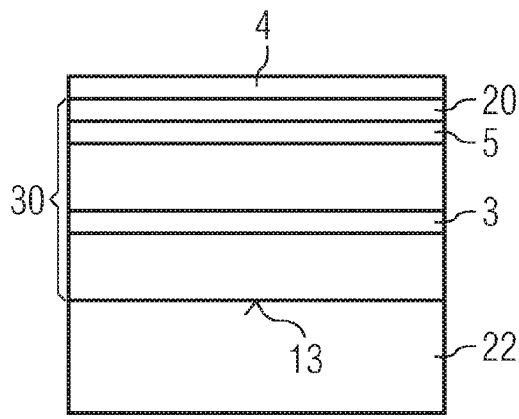
FIG. 6, shows in FIGS. 6A-6D, an additional embodiment of a method according to the invention for manufacturing a contact structure for an optoelectronic semiconductor chip suitable for generating radiation.

With reference to FIGS. 5A and 6A, a semiconductor layer sequence 30 is provided, comprising a barrier layer 5 as well as an active region 3 suitable for generating radiation. Semiconductor layer sequence 30 is arranged on a substrate 22. Substrate 22 is preferably a growth substrate, on which semiconductor layer sequence 30 with the monolithically integrated barrier layer 5 was grown epitaxially, for example, by MOVPE. The barrier layer 5 is preferably arranged on the side of the active region 3 facing away from substrate 22.

GaAs, for example, is suitable as a material for the growth substrate for a semiconductor layer sequence with an active region based on phosphite compound semiconductor material.

Differently from the embodiment according to FIG. 5, the semiconductor layer sequence 30 of the embodiment according to FIG. 6 has an additional layer, in particular, the intermediate layer 20, which according to FIG. 6A finishes the semiconductor body and is arranged in particular, on the side of barrier layer 5 facing away from the active region 3.

On the side of the semiconductor layer facing away from substrate 22, on barrier layer 5 according to the embodiment in FIG. 5A, on intermediate layer 20 according to the embodiment in FIG. 6A, a connection layer 4 is then applied. According to one embodiment, the application of the connection layer 4 comprises the application of a radiation-transmissive and electrically conductive oxide layer, in particular, a metal oxide layer such as a zinc oxide layer, a tin oxide layer or an indium-tin oxide layer. The connection layer 4 preferably further comprises dopants such as Al, in order to guarantee a low electrical contact resistance of the connection layer to the barrier layer 5. According to another embodiment, the application of connection layer 4 can comprise the application of a metal layer.

Figure 5B:
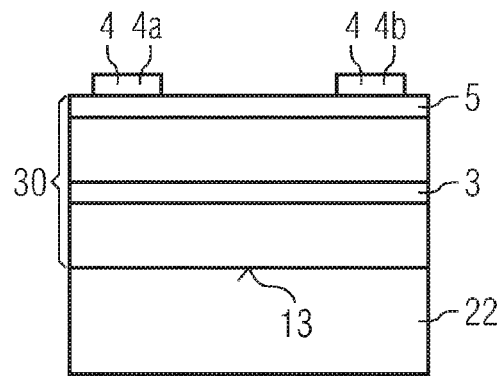
Figure 5D:
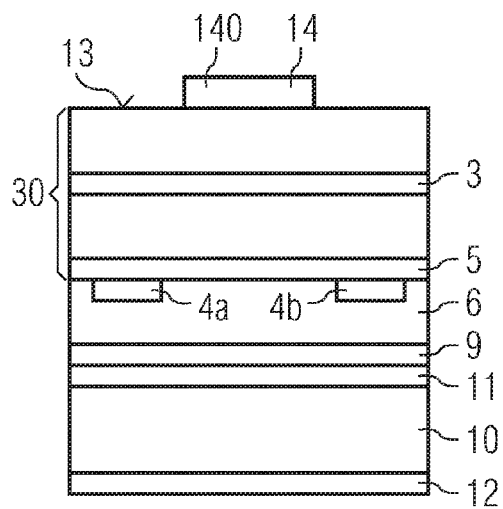
Figure 6B:
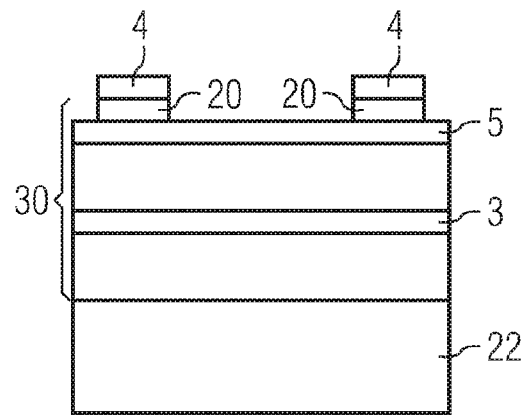
Figure 6C:
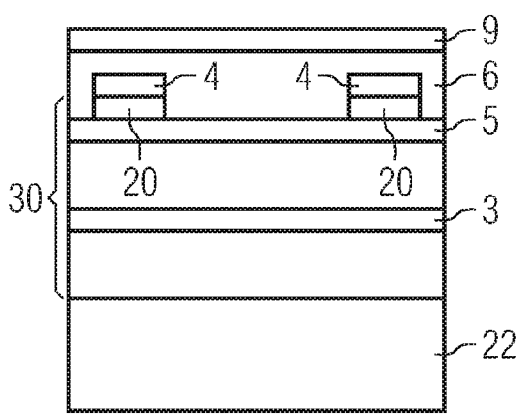

With reference to FIG. 5B and FIG. 6B, the connection layer 4 is then removed in certain areas to form a structured connection layer 4 and to expose areas of the barrier layer 5. In addition to areas of the connection layer 4, areas of intermediate layer 20 that are situated underneath the corresponding areas of the connection layer 4 are removed for this purpose in the embodiment according to FIG. 6. The removal of the connection layer 4 in certain areas is preferably performed in such a manner that individual separate connection elements 4A, 4B of connection layer 4 are formed, with spaces between them. Preferably, areas of the barrier layer 5 in which an injection of current into the semiconductor body of the chip is undesired in the finished semiconductor chip are exposed. By means of the removal of the connection layer 4, and optionally the intermediate layer 20 in certain areas, the electrical barrier areas and the electrical contact areas for the semiconductor chip are thus defined (see FIGS. 1-4). In particular, areas of the barrier layer 5 are exposed that are covered by a connection area 140 (not shown here) of an electrode 14 (not shown here) formed in a later step on an upper side 13 of the semiconductor layer sequence (referred to as an upper side because this side is the upper side in the finished semiconductor chip, see FIG. 5D). The structuring of the connection layer 4 can be performed, for example, by means of an etching process using a suitably structured etching mask. The same mask can advantageously be used for structuring intermediate layer 20.

Figure 5C:
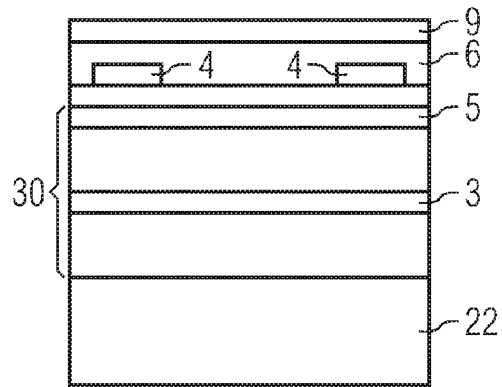

Then, with simultaneous reference to FIGS. 5C and 5D, a radiation-transmissive and electrically conductive contact layer 6 is applied to the structured connection layer 4 and to barrier layer 5. The contact layer 6 is transmissive particularly for the radiation that can be generated in the active region 3. The application of the radiation-transmissive and electrically conductive contact layer 6 can comprise the application of a radiation-transmissive and electrically conductive oxide layer, in particular, a metal oxide layer such as a zinc oxide, tin oxide or indium-tin oxide layer. The contact layer 6 can further comprise one or more dopants, e.g., Ga.

The contact layer 6 is applied to barrier layer 5 and structured connection layer 4 in such a manner that an electrical contact resistance of contact layer 6 to connection layer 4 is smaller than an electrical contact resistance of contact layer 6 to barrier layer 5.

The contact layer 6 thus essentially connects only electrically to the connection layer 4 and not to the barrier layer 5. Therefore contact layer 6 can be applied over the entire surface, with a subsequent structuring of the contact layer 6 not being necessary. A local and thus inhomogeneous current injection into the semiconductor layer sequence 30 can nonetheless be achieved.

For this purpose, contact layer 6 is preferably applied by means of a method in which a surface of barrier layer 5 to which the contact layer 6 is applied is damaged. A suitable method for causing damage to the surface of the barrier layer 5 is, for example, a physical deposition method such as a sputter method. Contact layer 6 can be applied after the structuring of connection layer 4 without the performance of an intervening cleaning step, for removing a natural oxide, for example. This can also have the effect that an electrical contact resistance of contact layer 6 to connection layer 4 is smaller than an electrical contact resistance of contact layer 6 to barrier layer 5.

Then a mirror layer 9, preferably constructed as a metal or a metallic alloy, is applied to contact layer 6. The mirror layer 9 can be deposited by means of vapor deposition or sputtering, for example. The mirror layer 9 can contain, for instance, gold, silver or aluminum. Because of the contiguously formed contact layer 6, a direct contact between mirror layer 9 and the semiconductor material of the semiconductor layer is prevented, whereby in turn a reflection alloy formation between the mirror layer and the semiconductor material is avoided.

Figure 6D:
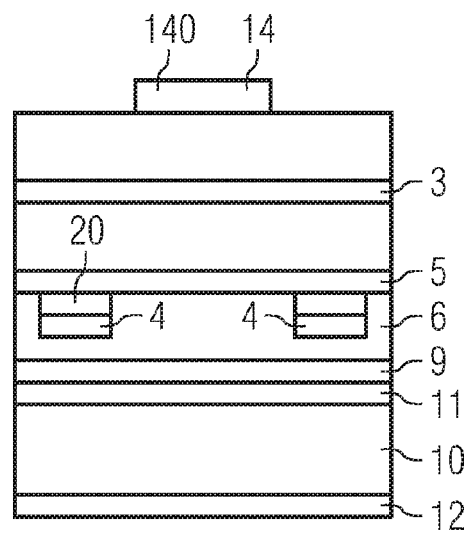

With simultaneous reference to FIG. 5D and FIG. 6D, the layer structure is then fixed on the side of the minor layer 9 facing away from substrate 22 to a carrier 10 by means of an adhesive 11. The carrier 10 can contain, for example, Ge or GaAs. Connecting layer 11 is preferably constructed to be electrically conductive. Connecting layer 11 can be implemented as a solder layer, an electrically conductive adhesive layer or as a layer formed by means of a wafer-bonding process. The substrate is subsequently removed at least in some areas (not shown) or completely from semiconductor layer sequence 30. The substrate can be removed, for example, by means of etching or a laser detachment method.

An electrode 14 with a connection area 140 is applied to the upper side 13 of semiconductor layer sequence 30. Connection area 140 of electrode 14 is arranged on the area provided for it in such a manner that the structured connection layer 4 is not covered by connection area 140.

If the structured connection layer is formed in such a manner that separate connection elements 4a, 4b (see FIG. 5D) are formed, then the lateral distance between the separate connection elements 4a, 4b is expediently larger than a lateral extent of connection area 140 of electrode 14.

A mounting electrode 12, a metallization, for example, for mounting the semiconductor chip on an external electrical lead is applied to a side of carrier 10 facing away from semiconductor layer sequence 30.

The invention is not limited to the description with reference to exemplary embodiments. Rather, the invention comprises every novel characteristic as well as every combination of characteristics, which includes, in particular, every combination of characteristics in the patent claims, even if this characteristic or this combination is not explicitly specified in the claims or exemplary embodiments.

The invention claimed is:

1. An optoelectronic semiconductor chip comprising:
    a semiconductor body having a semiconductor layer sequence with an active region suitable for generating radiation;
    a radiation-transmissive and electrically conductive contact layer arranged on the semiconductor body and electrically connected to the active region, the contact layer directly adjoining both a barrier layer of the semiconductor layer sequence and a connection layer applied to the semiconductor body and having a structure; and
    an electrode arranged on the semiconductor body on a side of the active region facing away from the barrier layer, the electrode having a connection area,
    wherein the connection layer has a cut out in a region of the barrier layer,
    wherein the region of the barrier layer where the connection layer has a cut out is free of the connection layer,
    wherein the contact layer directly adjoins the barrier layer in the region of the barrier layer,
    wherein from a top view of the active region of the semiconductor layer sequence, the region of the barrier layer covers the entire electrode,
    wherein the connection layer and the contact layer both adjoin the barrier layer,
    wherein the connection layer and the contact layer both comprise a radiation-transmissive and electrically conductive oxide, and
    wherein the connection layer and the contact layer are doped differently or their materials are selected such that an electrical contact resistance of the contact layer to the connection layer is lower than an electrical contact resistance of the contact layer to the barrier layer.

2. The semiconductor chip according to claim 1, wherein the contact layer extends through the cut out of the connection layer.

3. The semiconductor chip according to claim 1, further comprising an intermediate layer having a structure in the semiconductor layer sequence, the intermediate layer arranged between the connection layer and the barrier layer.

4. The semiconductor chip according to claim 3, wherein the intermediate layer has a cutout in an area covered by the electrode and the contact layer extends through the cutout of the intermediate layer.

5. The semiconductor chip according to claim 1, wherein the contact layer is formed as a continuous layer.

6. The semiconductor chip according to claim 1, wherein the barrier layer is formed as a continuous layer.

7. The semiconductor chip according to claim 1, wherein the semiconductor body has a cutout that tapers down in a direction of the active region, the contact layer extending into the cutout.

8. The semiconductor chip according to claim 1, wherein the conductive oxide of the connection layer is a metal oxide.

9. The semiconductor chip according to claim 8, wherein the metal oxide comprises zinc oxide, tin oxide or indium-tin oxide.

10. The semiconductor chip according to claim 1, further comprising a mirror layer that is arranged on a side of the contact layer facing away from the active region.

11. The semiconductor chip according to claim 10, wherein the minor layer comprises a metal.

12. The semiconductor chip according to claim 11, wherein the minor layer comprises Au, Ag or Al.

13. The semiconductor chip according to claim 1, wherein the barrier layer is arranged between the active region and the connection layer.

14. The semiconductor chip according to claim 1, wherein the semiconductor body is constructed as a thin-film semiconductor body.

15. The semiconductor chip according to claim 1, wherein the semiconductor chip comprises a carrier on which the semiconductor layer sequence is arranged, and wherein the contact layer is arranged between the semiconductor layer sequence and the carrier.

16. The semiconductor chip according to claim 15, further comprising a mirror layer that is arranged on a side of the contact layer facing away from the active region, wherein the mirror layer is arranged between the contact layer and the carrier.

17. The semiconductor chip according to claim 1, wherein the connection area of the electrode is provided for connecting the electrode to an external connection lead.

18. The semiconductor chip according to claim 1, wherein the electrical contact resistance of the contact layer to the connection layer exhibits ohmic behavior and the electrical contact resistance of the contact layer to the barrier layer exhibits non-ohmic behavior.

19. An optoelectronic semiconductor chip comprising:
a semiconductor body having a semiconductor layer sequence with an active region suitable for generating radiation;
a radiation-transmissive and electrically conductive contact layer arranged on the semiconductor body and electrically connected to the active region, the contact layer directly adjoining both a barrier layer of the semiconductor layer sequence and a connection layer applied to the semiconductor body and having a structure; and
an electrode arranged on the semiconductor body on a side of the active region facing away from the barrier layer, the electrode having a connection area, wherein the contact layer directly adjoins the barrier layer in a region of the barrier layer, said region covering the entire connection area of the electrode;
wherein the electrode comprises a plurality of electrically conducting webs for achieving a current expansion across an upper side of the semiconductor body, wherein the electrically conducting webs arranged on the semiconductor body start from the connection area of the electrode and are in direct electrical contact with the connection area;
wherein a barrier area is designed to have via webs and a region covering the entire connection area of the electrode is adapted to the electrode having the electrically conducting webs and the connection area;
wherein the via webs have a greater lateral extent than the corresponding electrically conducting webs; and
wherein the region covering the entire connection area of the electrode has a greater lateral extent than the connection area.

20. The semiconductor chip according to claim 19, wherein the entire connection area of the electrode is formed as a bonding pad.

21. The semiconductor chip according to claim 19, wherein, from a top view on the active region of the semiconductor layer sequence, the region the barrier layer is free of the connection layer and covers the entire electrode.

22. A method of manufacturing an optoelectronic semiconductor chip, the method comprising:
providing a semiconductor body having a semiconductor layer sequence with an active region suitable for generating radiation;
forming a radiation-transmissive and electrically conductive contact layer on the semiconductor body and electrically connected to the active region, the contact layer directly adjoining both a barrier layer of the semiconductor layer sequence and a connection layer applied to the semiconductor body and having a structure; and
forming an electrode on the semiconductor body on a side of the active region facing away from the barrier layer, the electrode having a connection area,
wherein the connection layer has a cut out in a region of the barrier layer,
wherein the region of the barrier layer where the connection layer has a cut out is free of the connection layer,
wherein the contact layer directly adjoins the barrier layer in the region of the barrier layer,
wherein from a top view of the active region of the semiconductor layer sequence, the region of the barrier layer covers the entire electrode,
wherein the connection layer and the contact layer both adjoin the barrier layer,
wherein the connection layer and the contact layer both comprise a radiation-transmissive and electrically conductive oxide, and
wherein the connection layer and the contact layer are doped differently or their materials are selected such that an electrical contact resistance of the contact layer to the connection layer is lower than an electrical contact resistance of the contact layer to the barrier layer.

23. The method according to claim 22, further comprising:
forming the connection layer on the semiconductor body;
wherein the radiation-transmissive and electrically conductive contact layer is formed on the semiconductor body in such a manner that the contact layer adjoins the connection layer and, over its entire surface, adjoins the semiconductor body in an area covered by a connection area of a provided electrode; and
wherein a structure of the connection layer and the electrode are matched to one another in such a manner that the connection layer is cut out over the entire surface in an area covered by the connection area of the electrode.

24. The method according to claim 23, wherein forming the contact layer comprises performing a sputter process.

25. The method according to claim 23, wherein the contact layer is formed immediately after formation of the connection layer.

26. The method according to claim 23, wherein forming the connection layer comprises forming a radiation-transmissive and electrically conductive oxide layer.

27. The method according to claim 26, wherein the electrically conductive oxide layer comprises a metal oxide layer.

28. The method according to claim 27, wherein the electrically conductive oxide layer comprises a zinc oxide layer, a tin oxide layer or an indium-tin oxide layer.

29. The method according to claim 23, wherein forming the connection layer comprises forming a metal-containing connection layer.

30. The method according to claim 29, wherein the metal-containing connection layer comprises AuGe or AuZn.

31. The method according to claim 23, further comprising forming a mirror layer to a side of the contact layer facing away from the connection layer.

32. The method according to claim 23, wherein a cutout that tapers down in the direction of a side of the semiconductor body facing away from the contact layer is formed in the semiconductor body before forming the contact layer.

33. A semiconductor chip manufactured according to the method of claim 23.

* * * * *

UNITED STATES PATENT AND TRADEMARK OFFICE
CERTIFICATE OF CORRECTION

PATENT NO. : 8,710,486 B2  
APPLICATION NO. : 12/523501  
DATED : April 29, 2014  
INVENTOR(S) : Reiner Windisch Page 1 of 1

It is certified that error appears in the above-identified patent and that said Letters Patent is hereby corrected as shown below:

In the Claims

In Col. 10, line 44, claim 11, delete "minor" and insert --mirror--.
In Col. 10, line 46, claim 12, delete "minor" and insert --mirror--.

Signed and Sealed this
First Day of July, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 8,710,486 B2
APPLICATION NO. : 12/523501
DATED : April 29, 2014
INVENTOR(S) : Reiner Windisch Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 199 days.

Signed and Sealed this

Twenty-ninth Day of September, 2015

Michelle K. Lee
*Director of the United States Patent and Trademark Office*